US005164225A

United States Patent [19]

Nire et al.

[11] Patent Number: 5,164,225

[45] Date of Patent: Nov. 17, 1992

[54] METHOD OF FABRICATING THIN-FILM EL DEVICE

[75] Inventors: Takashi Nire; Satoshi Tanda, both of Kanagawa, Japan

[73] Assignee: Kabushiki Kaisha Komatsu Seisakushi, Tokyo, Japan

[21] Appl. No.: 675,054

[22] PCT Filed: Aug. 5, 1988

[86] PCT No.: PCT/JP88/00780

§ 371 Date: Apr. 3, 1989

§ 102(e) Date: Apr. 3, 1989

[87] PCT Pub. No.: WO89/01730

PCT Pub. Date: Feb. 23, 1989

Related U.S. Application Data

[63] Continuation of Ser. No. 360,911, Apr. 3, 1989, abandoned.

[30] Foreign Application Priority Data

Aug. 7, 1987 [JP] Japan ............ 62-197712

[51] Int. Cl.[5] ............ C23C 14/00

[52] U.S. Cl. ............ 427/125; 427/123; 427/126.3; 427/438; 427/430.1

[58] Field of Search ............ 427/123, 126.3, 438, 427/430.1, 125

[56] References Cited

U.S. PATENT DOCUMENTS

| | | | |
|---|---|---|---|
| 3,731,353 | 5/1973 | Vecht | 427/123 |
| 4,082,908 | 4/1978 | Vanaglash | 427/438 |
| 4,122,215 | 10/1978 | Vratny | 427/438 |
| 4,125,648 | 11/1978 | Vratny | 427/438 |
| 4,153,518 | 5/1979 | Holmes | 427/126.3 |
| 4,344,817 | 8/1982 | Chamberlin | 427/126.3 |
| 4,614,668 | 9/1986 | Topp | 427/66 |
| 4,686,110 | 8/1987 | Endo | 427/126.3 |
| 4,693,906 | 9/1987 | Lindmayer | 427/126.3 |

OTHER PUBLICATIONS

B. P. Kryzhanovskii et al., "Conducting Layers of Indium Oxide Doped with Tin" Instrum & Exp Tech Dec. 1981 pp. 816–818.

*Primary Examiner*—Shrive Beck
*Assistant Examiner*—Vi Duong Dang
*Attorney, Agent, or Firm*—Diller, Ramik & Wight

[57] ABSTRACT

A method of fabricating a thin-film EL device comprising the steps of sequentially forming and stacking a first electrically conductive layer of first electrodes, a first insulating layer, a luminous layer, a second insulating layer and a second electrically conductive layer of second electrodes; previously forming a pattern of the first conductive layer all over a zone for formation of the first electrodes and a zone for formation of electrode terminals; and immersing it into a plating solution to selectively form a terminal pattern only on the first conductive layer, whereby the need for pattern aligning operation can be eliminated, only immersion of it into the plating solution enables easy formation of the precise terminal pattern without providing any damage to the elements of the EL device, and the obtained device can maintain its stable characteristics for a long period of time.

8 Claims, 4 Drawing Sheets

METHOD OF FABRICATING THIN-FILM EL DEVICE

This application is a continuation of application Ser. No. 07/360,911, filed Apr. 3, 1989, abandoned.

TECHNICAL FIELD

The present invention relates to a method of fabricating a thin-film EL (electroluminescence) device and, more particularly, to a method of forming electrodes of such a device.

BACKGROUND ART

These years, much attention has been focused on thin-film EL device using a thin-film phoshor layer instead of a dispersion EL device using zinc sulfide (ZnS) compound phoshor powder, because the former can provide a high luminance.

The thin-film EL device, in which a luminous layer is made in the form of a thin film to minimize halation or luminous blur caused by the scattering of externally incident light and of light emitted from the interior of the luminous layer and to thereby offer high sharpness and contrast, has been put on the stage as a device for mounting on vehicles, as such a display unit as in a computer terminal, or as an illumination device.

In the case where the thin-film EL device is used as a display, the EL device is constructed as a dot matrix type shown in FIGS. 2(*a*), (*b*) and (*c*) so that light-permeable surface and back electrodes 101 and 102 each takes the form of a pattern of stripes arranged as mutually spaced at intervals of a predetermined distance and as mutually intersected at a right angle, a luminous layer 103 is interposed between the surface and back electrodes, each of intersections between the surface and back electrode patterns forming one of the elements of the thin-film EL device. FIG. 2(*a*) is a perspective view, partly as cut away, of the EL device, FIG. 2(*b*) is a plan view thereof and FIG. 2(*c*) is a cross-sectional view thereof.

More in detail, first and second insulating layers 104 and 105 are disposed between the luminous layer 103 and the surface and back electrodes 101, 102 respectively.

And the light emitting process of this thin-film EL device is as follows.

First, when a voltage is applied between the patterns of the surface and back electrodes 101 and 102 in response to an input signal, electric fields are induced in the luminous layer 103 at the intersections between these patterns so that electrons so far trapped at the interface level are released therefrom and accelerated, whereby the electrons acquire sufficient energy to be bombard with orbital electrons of luminous center impurities, thereby exciting the orbital electrons. When the thus excited luminous center electrons return to the ground or normal state, they emit light.

With such a thin-film EL device, the electrodes of the elements of the EL device are provided at their one ends with terminals 106 which are to be connected to an external controller (not shown) through associated lead wires and which terminals are usually made of a nickel (Ni) film.

Such terminals 106 have been conventionally formed by an electron beam evaporation process after the sequential formation of the surface electrode 101 pattern, first insulating layer 104, luminous layer 103, second insulating layer 105 and then back electrode 102 pattern.

In the patterning process, the nickel thin-film pattern has been made usually by a selective evaporation process, that is, by the electron beam evaporation process using a metal mask.

This selective evaporation process, however, has had such a problem that the pattern edge does not correspond exactly to the mask, that is, the pattern shape cannot be sharply defined with a bad pattern accuracy.

Such an EL device has also been defective in that, because the electrodes of the device have a high pitch of about 0.5 mm, it is highly difficult to align such a fine pattern with the metal mask and thus its yield is reduced due to the positional shift in the pattern.

To eliminate such problems, there has been proposed a method in which terminal patterning is carried out by a photolithographic process.

In this method, as shown in FIG. 3(*a*), elements are first formed and then a nickel thin film 106' are made in the form of a strip by the electron beam evaporation process.

Subsequently, patterning is effected by the photolithographic process to form a nickel terminal 106, as shown in FIG. 3(*b*).

This method is advantageous in that the pattern accuracy is improved but disadvantageous in that the impurity ions or moisture often causes the deterioration of the elements of the EL device in the etching step and further the number of steps in the photolithographic process is large, resulting in that the cost of the associated photo masks is high, and so on.

It is generally known that the elements of a thin-film EL device are subjected to a damage by moisture or impurity ions in the etching step. This phenomenon has been a serious problem in the thin-film EL device, since the device is operated, in particular, under a high electric field so that the frequent use of the device causes the moisture adsorbed on the device in the electric field to be broken down and penetrated into the interfaces of the films, thus causing the film release and involving the shortened operational life.

In view of the above circumstances, it is an object of the present invention to provide a thin-film EL device which is easy to fabricate and high in reliability.

DISCLOSURE OF INVENTION

In accordance with the present invention, there is provided a method of fabricating a thin-film EL device comprising the steps of sequentially forming on a substrate a first electrically conductive layer of first electrodes, a first insulating layer, a luminous layer, a second insulating layer, and a second electrically conductive layer of second electrodes; wherein the first conductive layer pattern is previously formed all over a first electrode formation zone and an electrode-terminal formation zone, and then immersed into a plating solution to selectively form a terminal pattern only on the first conductive layer. The subsequent steps may be ordinary steps which are known in fabricating a thin-film EL device. In the present invention, the edges of the second electrodes are formed as partly overlapped with the terminal pattern.

According to the above method, the need for pattern aligning operation can be eliminated, only immersion into the plating solution enables easy formation of the highly accurate terminal pattern, and the stable characteristics can be sustained over a long period of time without damaging the device.

BEST MODE FOR CARRYING OUT THE INVENTION

An embodiment of the present invention will be detailed by referring to the accompanying drawings.

Figure 1:
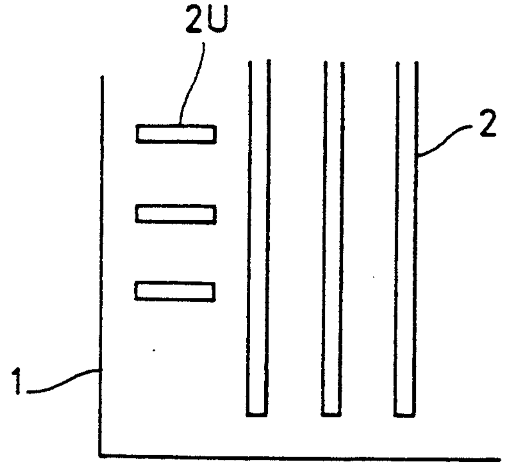
FIGS. 1(*a*), 1(*b*), 1(*c*), 1(*d*), 1(*e*) show respectively different steps in a process of fabricating a thin-film EL panel in accordance with an embodiment of the present invention.
Figure 1:
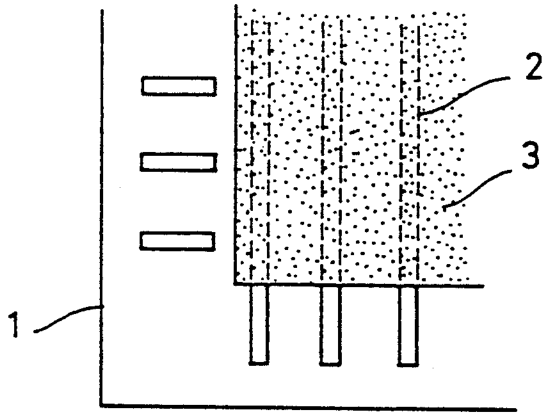
Figure 1:
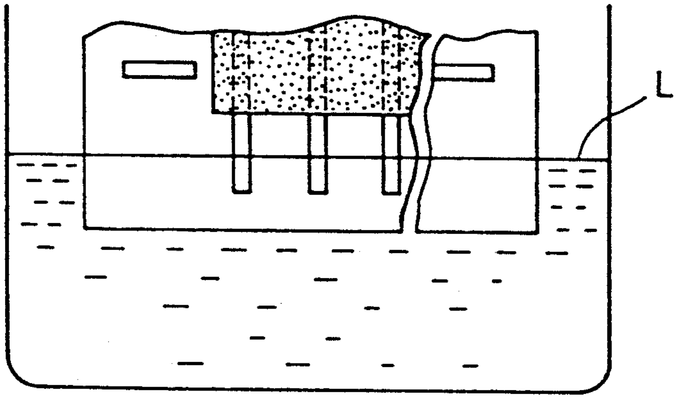
Figure 1:
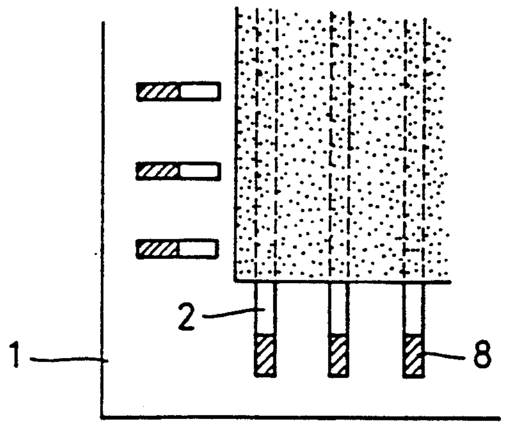
Figure 1:
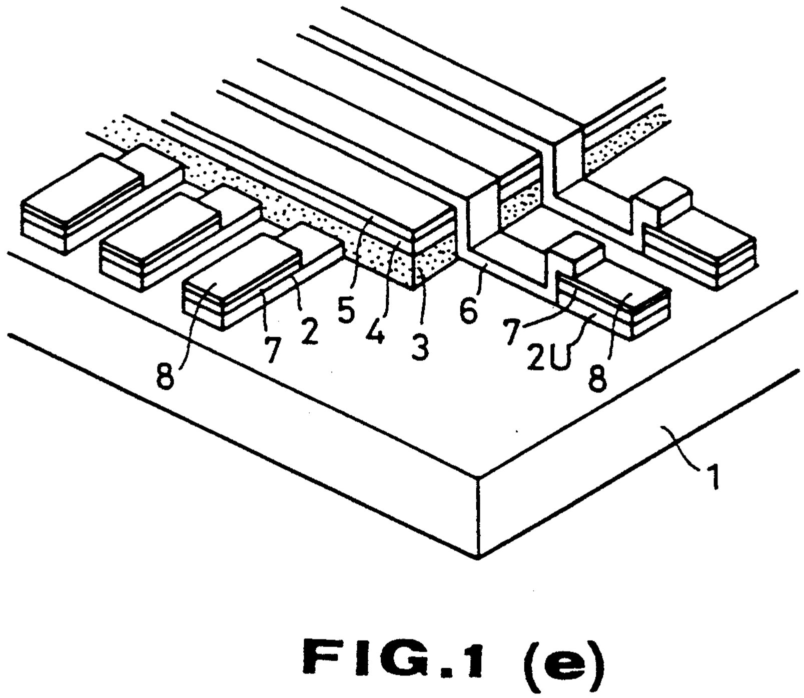
Figure 2A:
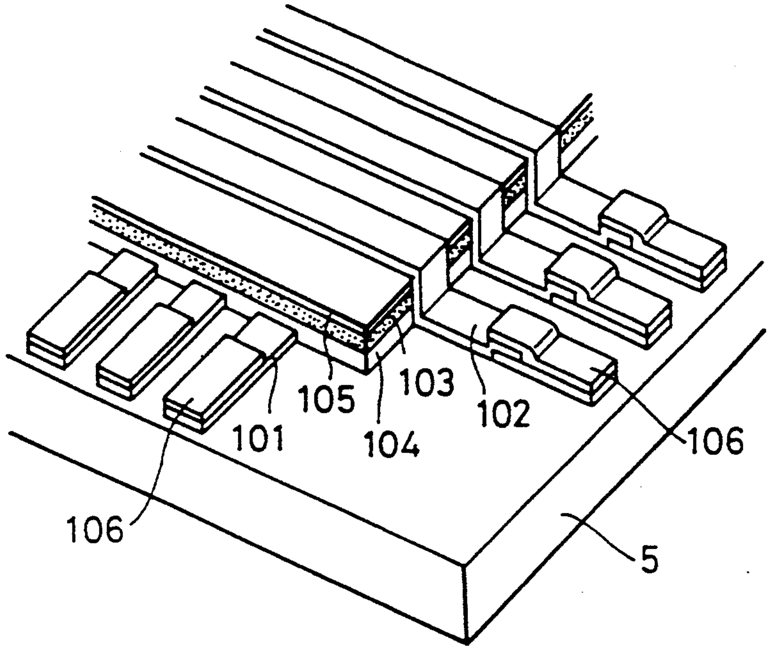
FIGS. 2(*a*), 2(*b*), 2(*c*) are diagrams for explaining a structure of an ordinary thin-film EL panel.
Figure 2B:
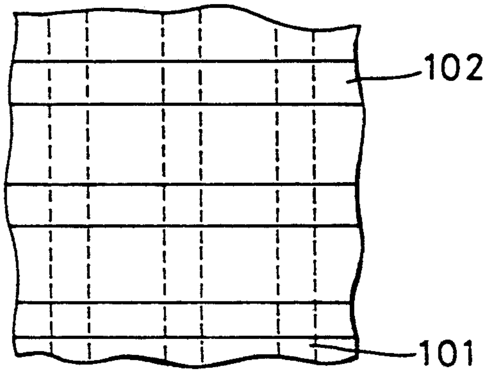
Figure 2C:
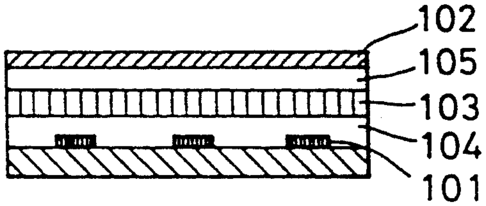
Figure 3:
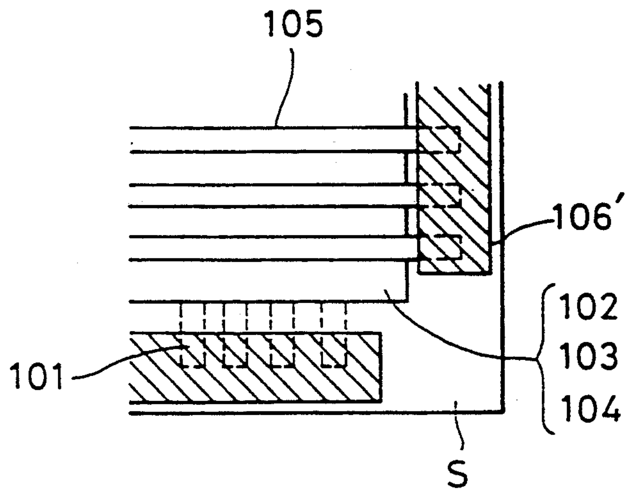
FIGS. 3(*a*) and 3(*b*) show an electrode-terminal forming step in a prior art process of fabricating a thin-film EL device.
Figure 3:
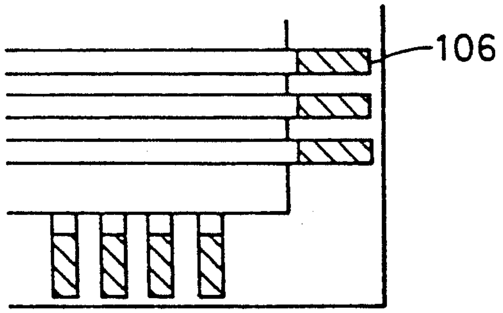

FIGS. 1(*a*) to 1(*e*) show steps in a method of fabricating a thin-film EL panel in accordance with an embodiment of the present invention.

Referring first to FIG. 1(*a*), an Indium tin oxide (ITO) layer is formed on a glass substrate 1 by a sputtering process and then is subjected to a patterning by a photolithographic process to form a light-permeable strip pattern of surface electrodes 2 arranged at intervals of a predetermined spacing and an underlying terminal-formation pattern 2U provided on one end of the substrate as extended perpendicular to the strip pattern.

Then, as shown in FIG. 1(*b*), a first insulating layer 3 made of tantalum pentoxide ($Ta_2O_5$) is formed on the substrate obtained in the previous step, by the sputtering process, during which a metal mask is used so as not to cover one ends of the surface electrodes and the entire underlying pattern 2U, that is, to expose them.

As shown in FIG. 1(*c*), the resultant substrate is next immersed a total of four times into an electroless nickel plating solution by a predetermined depth sequentially from its four sides so that the each side immersion of the substrate causes the solution level to reach L, whereby a nickel plated layer 7 is formed. After this, the nickel plated layer is further subjected similarly to an electroless gold plating application thereon to form a gold plated layer 8. As a result, terminals of each two-layer (nickel and gold layers) structure are formed (see FIG. 1(*d*)).

In this connection, the nickel plating solution may comprise, for example, 39 g/l of $NiSO_4.6H_2O$, 30 g/l of $NaH_2PO_2H_2O$, 20 g/l of $NH_2CH_2COOH$, 20 g/l of $Na_3C_6H_5O_72H_2O$, and 2 ppm of $Pb(NO_3)_2$ in composition, and the pH level and temperature of the solution are adjusted to be 5-6 and 80°-90° C. respectively.

The gold plating solution may comprises, for example, 28 g/l of potassium gold cyanide, 60 g/l of citric acid, 45 g/l of tungstic acid, 16 g/l of sodium hydroxide, 3.75 g/l of N-N-diethylglycine sodium and 25 g/l of potassium phthalate in composition, and be adjusted to be 5-6 and 85°-93° C. in pH and temperature respectively.

Following the above steps, a luminous layer 4 made of zinc sulfide (ZnS) containing terbium (Tb) as luminous centr impurity, i.e., of ZnS:Tb, a second insulating layer 5 made of $Ta_2O_5$ and a strip-shaped pattern of back electrodes 6 made of aluminum (Al) are formed by an ordinary method to complete such a thin-film EL panel of a dot matrix type as shown in FIG. 1(*e*).

The pattern of the back electrodes 6 is arranged as extended perpendicular to the aforementioned surface electrode pattern and also as overlapped partly with the terminals of the nickel and gold plated layers 7 and 8 to allow ends of the terminals to be exposed and electrically connected to an external device.

With the thin-film EL panel thus completed, each of the overlapped or intersected parts between the patterns of the surface and back electrodes 2 and 6 corresponds to one of the picture elements of the panel, and the supply of power from ones of the terminals corresponding to picture information allows corresponding picture elements to emit light.

In accordance with a method of an embodiment of the present invention, a highly precise terminal pattern can be realized highly easily without causing any damage to the elements of the panel.

Accordingly, there is provided a thin-film EL panel which can prevent deterioration of elements in the panel due to film release or the like even when the panel is used for a long period of time, and therefore can keep the reliability high and the cost low and can prolong the life.

Although explanation has been made in connection with the case where the underlying or substrate side corresponds to the transparent electrodes in the foregoing embodiment, the method of the present invention may be applied also to a thin-film EL device of a type having transparent electrodes as the top layer side.

In the latter case, when the (back) electrodes and the terminal underlying pattern are made of aluminum, it becomes difficult to plate the terminal pattern with nickel. This is because aluminum is larger in electronegativity than nickel and thus dissolves into the nickel solution. Thus, any one must be taken of the methods of forming the terminal pattern made of metal other than aluminum, of selecting such materials as do not dissolve into a plating solution to be ued as the materials of the (back) electrodes and underlying pattern, or of previously providing a special pretreatment so as to allow the nickel plating.

The plating step has been carried out after the formation of the first insulating layer in the foregoing embodiment, but it may be effected before the formation of the first insulating layer. Further, it is unnecessary always for the terminal to have two-layer structure and the terminal may be made to be, for example, of a single nickel layer type.

Furthermore, the above explanation has been made as to the dot matrix type thin-film EL panel in the foregoing embodiment, but it goes without saying that the present invention is limited to the particular embodiment.

As has been explained in the foregoing, in accordance with the present invention, on fabricating a thin-film EL device comprising a first electrically conductive layer of first electrodes, a first insulating layer, a luminous layer, a second insulating layer, and a second electrically conductive layer of second electrodes sequentially stacked on a substrated; the first electrically conductive layer pattern is previously formed all over a first-electrode formation zone and an electrode-terminal formation zone and a terminal pattern is selectively formed on the first conductive layer pattern. As a result, a thin-film EL device can be provided that is easy to fabricate and long in life.

Industrial Applicability

The method of the present invention is effective in formation of, in particular, a dot matrix type thin-film EL panel.

According to this method, even when it is desired to make a thin-film EL panel having EL elements arranged at a high density, there can be realized a thin-film EL panel which is easy to fabricate and high in realiability.

We claim:

1. A method of fabricating a thin-film EL device on a substrate having first and second peripheral portions, comprising the steps of:

forming a pattern of a conductive layer comprising a plurality of first electrodes and first electrode terminals to be integrally formed with the first electrodes on the substrate over a zone for formation of the first electrodes and the first electrode terminals and a plurality of second electrode terminals on the substrste over a zone for formation of the second electrode terminal, such that the first electrode terminals are located at the first peripheral portion and the second electrode terminals are located at the second peripheral portion;

immersing into plating solution the first and second peripheral portions on which the first and second electrodes are formed without immersing portions of said substrate inboard of said first and second peripheral portions, thereby selectively forming a plating layer serving as first and second terminals only on said conductive layer within said first and second peripheral portions by using selective plating method;

forming a first insulating layer over the first electrodes;

forming a luminescent layer on the first insulating layer;

forming a second insulating layer on the luminescent layer; and forming a plurality of second electrodes on the second insulating layer and the edge portions of the second electrode terminals such that the second electrode terminals are connected respectively to the second electrodes.

2. A method of fabricating a thin-film EL device on a substrate having first and second peripheral portions, comprising the steps of:

forming a pattern of a conductive layer comprising a plurality of first strips of first electrodes and first electrodes terminals on the substrate over a zone for formation of the first electrodes and the first electrode terminals and a plurality of second electrode terminals on the substrate over a zone for formation of the second eletrodes terminals, such that the first electrode terminals of the first strips are located at the first peripheral portion and the second strips are located at the second peripheral portion;

immersing into plating solution the first and secont peripheral portions on which the first and second electrodes are formed without immersing portions of said substrate inboard of said first and second peripheral portions, thereby selectively forming a plating layer serving as first and second terminals only on said conductive layer within said first and second peripheral portions by using selective plating method;

forming a first insulating layer over the first electrodes;

forming a luminescent layer on the first insulating layer;

forming a second insulating layer on the luminescent layer; and forming a plurality of second strips of second electrodes on the second insulating layer and the edge portions of the second electrode terminals such that the second electrode terminals are connected respectively to the second electrodes, such that the second strips of the second electrodes are substantially perpendicular to the first strips.

3. A method os fabricating a thin-film EL device as set forth in claim 2, wherein said conductive layer is made of indium tin oxide (ITO) and said step of forming the first and second electrode terminals include an electroless nickel plating step.

4. A method of fabricating a thin-film EL device as set forth in claim 2, wherein said conductive layer is made of indium tin oxide (ITO) and said step of forming the first and second electrode terminals includes electroless nickel plating step and an electroless gold plating step.

5. A method of fabricating a thin-film EL device as set forth in claim 1, wherein said conductive layer is made of indium tin oxide (ITO) and said step of forming the first and second electrode terminals is an electroless nickel plating step.

6. A method of fabricating a thin-film EL device as set forth in claim 1, wherein said conductive layer is made of indium tin oxide (ITO) and said step of forming the first and second electrode terminals includes an electroless nickel plating step and an electroless gold plating step.

7. A method of fabricating a thin-film EL device as set forth in claim 1, wherein said substrate is rotated at least 90 degrees after the first peripheral portion is immersed into the plating solution and before the second peripheral portion is immersed into the plating solution.

8. A method of fabricating a thin-film EL device as set forth in claim 2, wherein said substrate is rotated at least 90 degrees after the first peripheral portion is immersed into the plating solution and before the second peripheral portion is immersed into the plating solution.

* * * * *